United States Patent [19]
Binstead

[11] Patent Number: 5,844,506
[45] Date of Patent: Dec. 1, 1998

[54] MULTIPLE INPUT PROXIMITY DETECTOR AND TOUCHPAD SYSTEM

[76] Inventor: Ronald Peter Binstead, 15 Seely Rd., Radford, Nottingham, Great Britain, NG7 1NU

[21] Appl. No.: 718,356

[22] PCT Filed: Apr. 5, 1995

[86] PCT No.: PCT/GB95/00767

§ 371 Date: Oct. 3, 1996

§ 102(e) Date: Oct. 3, 1996

[87] PCT Pub. No.: WO95/27334

PCT Pub. Date: Oct. 12, 1995

[30] Foreign Application Priority Data

Apr. 5, 1994 [GB] United Kingdom .................. 9406702

[51] Int. Cl.$^6$ .................................................. H03K 17/94
[52] U.S. Cl. .............................. 341/34; 341/20; 341/33; 345/173; 178/19.01
[58] Field of Search ................................. 341/20, 22, 26, 341/33, 34; 340/870.37; 345/173, 174, 179; 178/18, 19, 20, 18.01, 19.01, 20.01

[56] References Cited

U.S. PATENT DOCUMENTS 4,686,332  8/1987  Greanias et al. ......................... 178/19

FOREIGN PATENT DOCUMENTS

0078676A  11/1983  European Pat. Off. .
0609021A  3/1994   European Pat. Off. .
3910977A  11/1990  Germany .

Primary Examiner—Michael Horabik
Assistant Examiner—Andrew Hill
Attorney, Agent, or Firm—Cahill, Sutton & Thomas P.L.C.

[57] ABSTRACT

A touchpad, which may include a keypad array, digitizing tablet, touch screen or an electronic mouse, is operable through a suitable dielectric medium, operating by capacitive effect and suitable for use as a computer interface in conjunction with a monitor screen, or as a computer input device in a number of applications, for example, as a cash till keypad.

16 Claims, 9 Drawing Sheets

First grid

Second grid

Fig. 10

MULTIPLE INPUT PROXIMITY DETECTOR AND TOUCHPAD SYSTEM

The present invention relates to a multiple input proximity detector/touchpad system which may comprise, for example, a keypad array, digitising tablet, touchscreen or an electronic mouse which may be operated through a variable thickness of glass or other dielectric medium, and more particularly to the design of a multiple input proximity detector/touchpad system in which a large matrix of keys or a large touch sensitive area may be formed using the superposition of, for example, orthogonally arranged conducting elements. The conducting elements, and the electronic scanning system to service the conducting elements are particularly arranged to obtain optimized sensitivity.

In European Patent No. EP-0185671 there is described a touch operated keyboard for attachment to one face of a sheet of glass comprising a plurality of keypads disposed adjacent each other in a desired pattern, together with interrogation means for assessing the condition of the keypads, indicating when a keypad, or keypads have been operated by a user, and an electronic scanning and processing system for providing means for threshold value generation and drift compensation.

The threshold value generation means is operative to determine repeatedly at predetermined intervals the required capacitance level associated with any keypad in order to indicate that that keypad has been operated by a user.

The drift compensation means is operative to offset variations in capacitance caused by varying background conditions.

The present invention is directed towards the construction of a multiple input proximity detector/touchpad system, which may comprise a keypad array, digitising tablet, touchscreen or an electronic mouse, wherein the position of a user's finger or other object touching, or in close proximity to the "touch sensitive" surface area, hereinafter referred to as a touchpad, is determined by means of the capacitive effect of that finger on multiple conductor elements (hereinafter referred to as a keystroke), and to the optimisation of sensitivity of the touchpad, particularly when the touch sensitive area becomes relatively large. It is intended that throughout the present specification, reference to a "finger" is intended to include any object that would exert sufficient capacitive influence to be detected by the touchpad.

It should be noted that the activation of a "keypad" or area of the touchpad can be achieved without pressure on, or even without physical contact with, the surface of the touchpad, although in normal mode of operation, the user's finger would contact the touchpad surface or a surface associated therewith.

Other known types of touchpad, such as membrane switches having two sets of conductors face to face, require the use of pressure on two conducting elements at an intersection of those conducting elements. Pairs of conducting elements may be scanned in systematic manner to determine which, if any, intersection has been pressed. Disadvantages of this system are that there are moving parts (eg. the upper surface presented to the user's finger) which can therefore be subject to damage, and also that the positioning of the user's finger must coincide with the conducting element intersection. This method employs a set of driver conductors and a set of sensing conductors.

U.S. Pat. No. 4,686,332 discloses a touchpad comprising a horizontal and vertical grid of transparent conductors which are plated onto a substrate and which provide unique finger touch sensing and unique stylus location sensing.

The present invention uses only sensing conductors and has no moving parts. It can thus be well protected from damage by users by the glass or other dielectric medium covering the touchpad. The electronic scanning of the conducting elements requires connection to only one element at a time, and all other elements can be placed in condition to reduce interference when not being scanned. The present invention further permits detection of the user's finger at any point on the touchpad's active surface, and the electronic scanning mechanism could be arranged to assign predetermined areas of the touchpad to be interpreted as discrete keypads, or "boxes".

Of fundamental importance to such a touchpad system is the sensitivity of the apparatus to the proximity of a finger when compared with normal variations in capacitance. This ensures reliable indication of an intentional "keystroke" as previously described, and the determination with a high degree of accuracy of the position of that finger. The position of the finger may be a digital representation of which "box" or predetermined area of the touchpad has been activated from a set of possible boxes, or predetermined areas, or alternatively an analogue representation of the position by, for example, x-y coordinates.

The present invention is further directed towards the achievement of this required sensitivity, by a number of alternative embodiments which may be used separately or in conjunction with one another.

Applications of such a touchpad are many and diverse, for example:

- as a touchscreen interface for a computer system, the keyboard being located immediately in front of a display unit which may be, for example, a cathode ray tube or liquid crystal display;
- a cash till keypad, where there would normally be many buttons for specific or different types of merchandise (the present invention is particularly suited to this application where the till operator is likely to have dirty or greasy hands, since the invention can provide a smooth glass for the keypad surface which is easily wiped clean);
- as an equivalent to a "mouse" input device to a computer system where the screen cursor is moved by moving one's finger across the surface of a touchpad;
- as a standard layout keyboard for use in a hostile environment;
- as many discrete proximity sensing keys.

In the environment of a cathode ray tube, or other static-or interference-generating device, it may be necessary to protect the touchpad from such static by known means, for example a transparent earthing shield. Alternatively, an actively driven back plane may be used.

In a general aspect the present invention provides a multiple input proximity detector in which the juxtaposition of two or more independent sensor inputs are used to determine the proximity of a finger, such detection only being accepted as valid when all the sensor inputs indicate a valid detection, where such inputs may be juxtaposed next to a range of other inputs in unique combination such that when any one combination gives a true detection for all its individual inputs, a unique valid detection is determined.

According to the present invention there is provided a touchpad comprising an electrically insulating membrane with a first series of spaced apart conductors on a first face of the membrane and a second series of spaced apart conductors on or proximal thereto, in which there is no electrical contact between the first and second series of conductors, each conductor in said series being sensitive to the proximity of a finger to modify the capacitance of said conductor to detect the presence of said finger positioned close to that conductor and in which the first and second conductors comprise fine wires to be substantially invisible when the touchpad is used as a touchscreen. The wires are preferably of a size between 10 to 25 microns.

Embodiments of the present invention will now be described by way of example with reference to the accompanying drawings in which.

Figure 1:
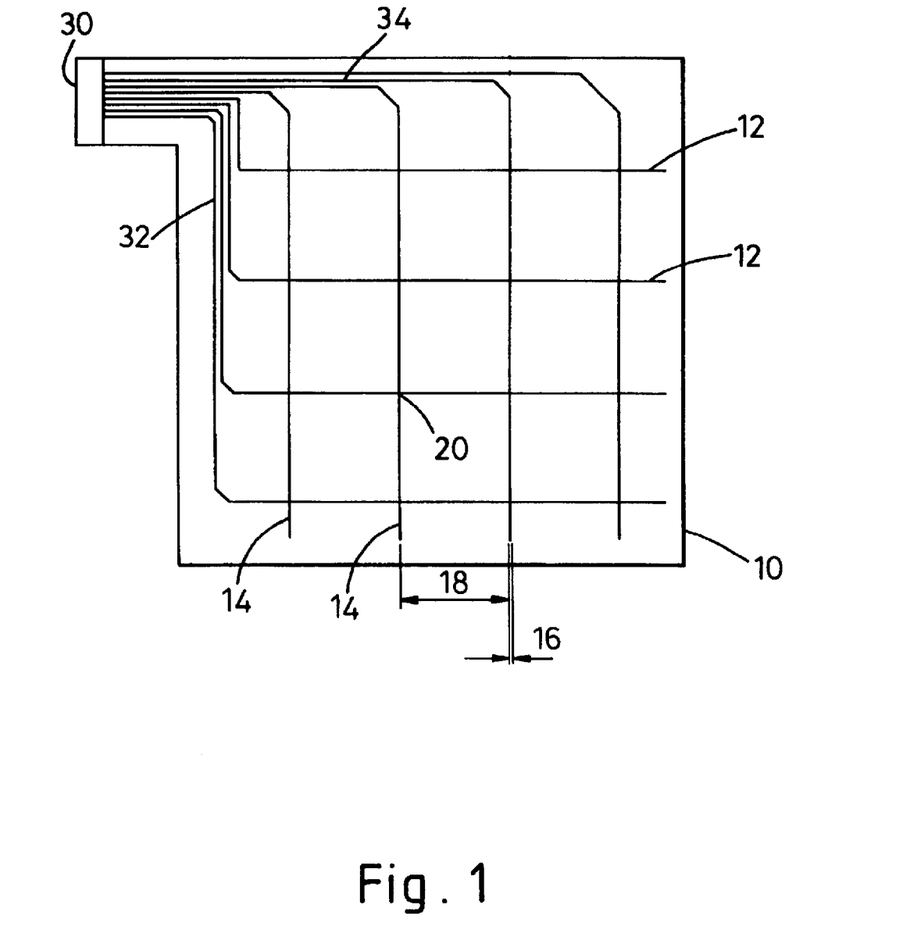
FIG. 1 shows in plan view a touchpad according to the present invention.
Figure 2A:
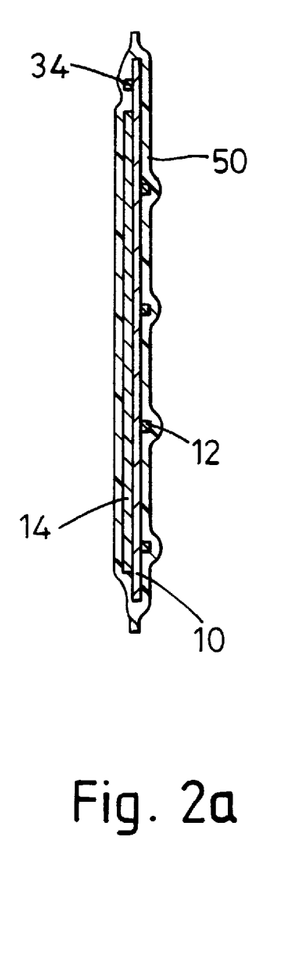
FIGS. 2a, 2b and 2c show in alternative embodiments cross-sections through the touchpad of FIG. 1, not to scale.

With reference to FIGS. 1 and 2a, and according to one embodiment of the invention, there is provided a thin dielectric film 10 on which is deposited on one face by an appropriate technique such as screen printing or similar lithographic process, a pattern of electrically conducting material forming a first series of parallel conductor elements 12 with appropriate connections at one or both ends. On the other face of the thin dielectric film 10, by a similar technique, there is provided a pattern of electrically conducting material forming a second series of parallel conductor elements 14 with appropriate connections at one or both ends which are orthogonal to, but not in electrical contact with the first series. The first and second series of conductor elements thus form a plurality of intersections 20. Appropriate material for these conductor elements 12, 14 is, for example, silver-based conducting ink. If the conductor elements are to be of low visibility where the touchpad is being used in front of a display system, then indium oxide is an appropriate material.

In other embodiments, the first and second series of conductor elements need not be parallel, nor is it necessary for the first and second series of conductor elements to be mutually orthogonal. The second series of conductor elements may be deposited onto a second thin dielectric film, the second film being superimposed on the first dielectric film in order to achieve similar effect of separation of the first and second series of conductor elements by a dielectric layer.

It is also possible to effect the superposition of the conducting elements in other ways. For example, in FIG. 2b the first series of conductor elements 12 may be deposited onto the thin dielectric film, 10 and an insulating layer 13 deposited thereupon. The second series of conducting elements 14 may then be deposited over the insulating layer. Thus, the insulating layer 13 forms a membrane structure between the first and second series of conducting elements.

The insulating layer 13 need not, however, be continuous over the entire touchpad surface: it is only necessary to insulate the intersections of the first and second series of conductor elements. In FIG. 2c, this arrangement is shown, where small regions of insulating material 13' are deposited over the first series of conducting elements 12 at the proposed intersection points. The second series of conductor elements 14 may then be deposited. In this instance, the small regions of insulating material 13' in conjunction with the dielectric film 10 form a membrane structure separating the first and second series of conductor elements.

Connection to the conductor elements 12 and the conductor elements 14 is made by further conducting elements 32, 34 respectively deposited and/or defined in similar manner to conductor elements 12, 14. A connection to the touchpad scanning system is made by connector 30 using an appropriate connection system.

In the embodiments of FIGS. 1 and 2a–2c, the width 16 of the conductor elements 12 and 14 is small compared with the inter-element spacing 18. If the conducting material being used to form conductor elements 12, 14 is of low conductivity, an alternative pattern of conductor element may be used as described later.

In another embodiment, the inter-element spacing 18 need not be identical for each adjacent pair of conductor elements.

Figure 2B:
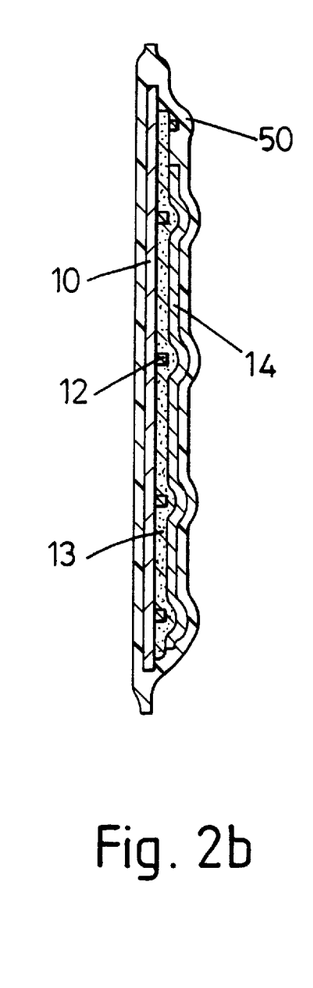
Figure 2C:
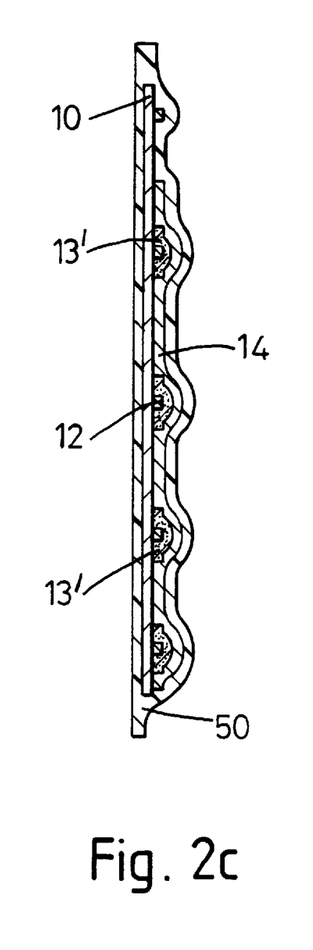

The sensitivity of the touchpad and its immunity to extraneous interference has been found to be enhanced by the encapsulation of the dielectric film 10 and conducting elements 12, 14, 32, 34 in a dielectric laminate 50, as shown in FIGS. 2a–2c. The dielectric laminate may be a plastic film, and can be formed using well known techniques such as heat sealing. This provides a constant dielectric environment in the immediate proximity of the conductor elements, eliminates the influence of moisture which might otherwise be present on the conductor elements, and further improves the robustness of the apparatus.

High sensitivity to changes in capacitance of a conductor element or group of conductor elements caused by the proximity of a finger or other object is achieved by minimising the cross-coupled capacitance between the conductor elements 12 and the conductor elements 14. This can be achieved in one embodiment by the use of highly conductive material (such as silver) and the forming of conductor elements which have a very narrow width 16 when compared to the conductor spacing 18 as previously described, such that the capacitance of the intersections 20 is small. In the event that it is desirable that a lower conductivity material be used (e.g. indium oxide), or that the dimensions of the touchpad become sufficiently large such that there is substantial resistance along a conductor element, then alternative patterns may be considered such as those embodied in FIG. 3a and 3b.

Figure 3A:
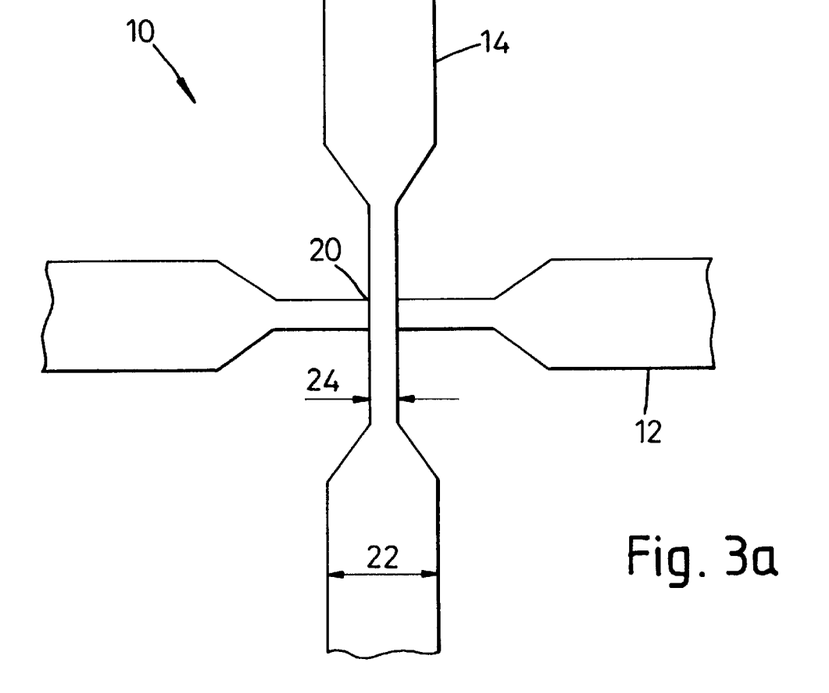
FIGS. 3a and 3b show embodiments of intersection points of two conducting elements.

In FIG. 3a, where the conductor elements have a more substantial width 22, at the intersections 20 the width 24 is greatly reduced.

Figure 3B:
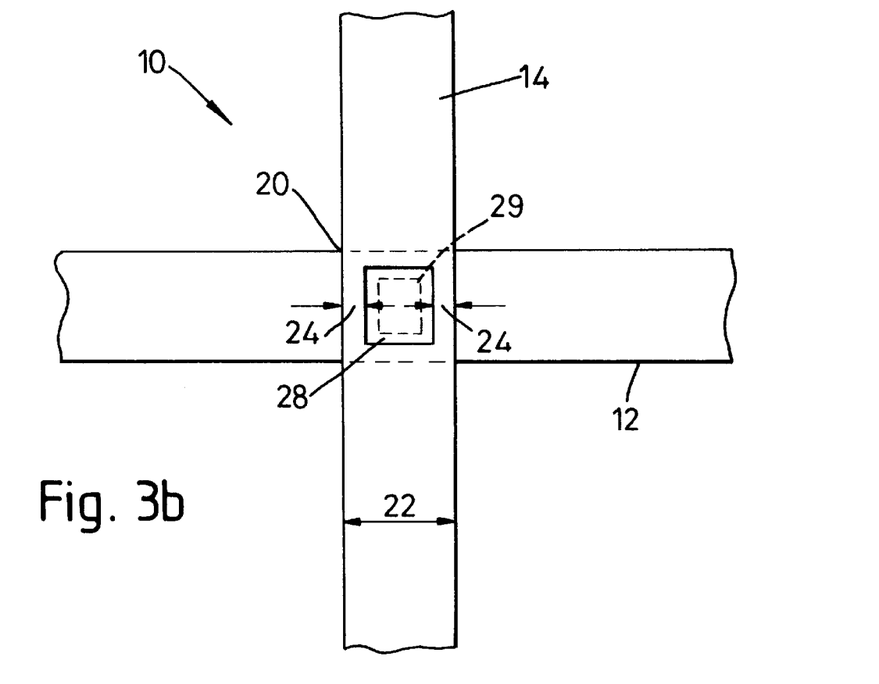

In FIG. 3b, the conductor elements 12 and 14 maintain full width 22, but the second conductor element 14 has a "window" area 28 which has no conductive material. This "window" allows the necessary capacitive link to the first conductive element 12. The window area 28 need not be completely open. As indicated by dotted line 29, an area of conductor material electrically isolated from the second conductor element 14 can in fact be left within the window 28 and still provide the necessary capacitive link to the first conductor element 12.

The relative thicknesses of the conductor elements thus can be varied to suit the conductivity of the material being used, the length of the tracks, and other constraining factors. It is noted that the smaller width tracks can result in better resolution and higher speed of operation, but use of the wider tracks can be acceptable for lower resolution, less sensitive or slower requirements.

Figure 4:
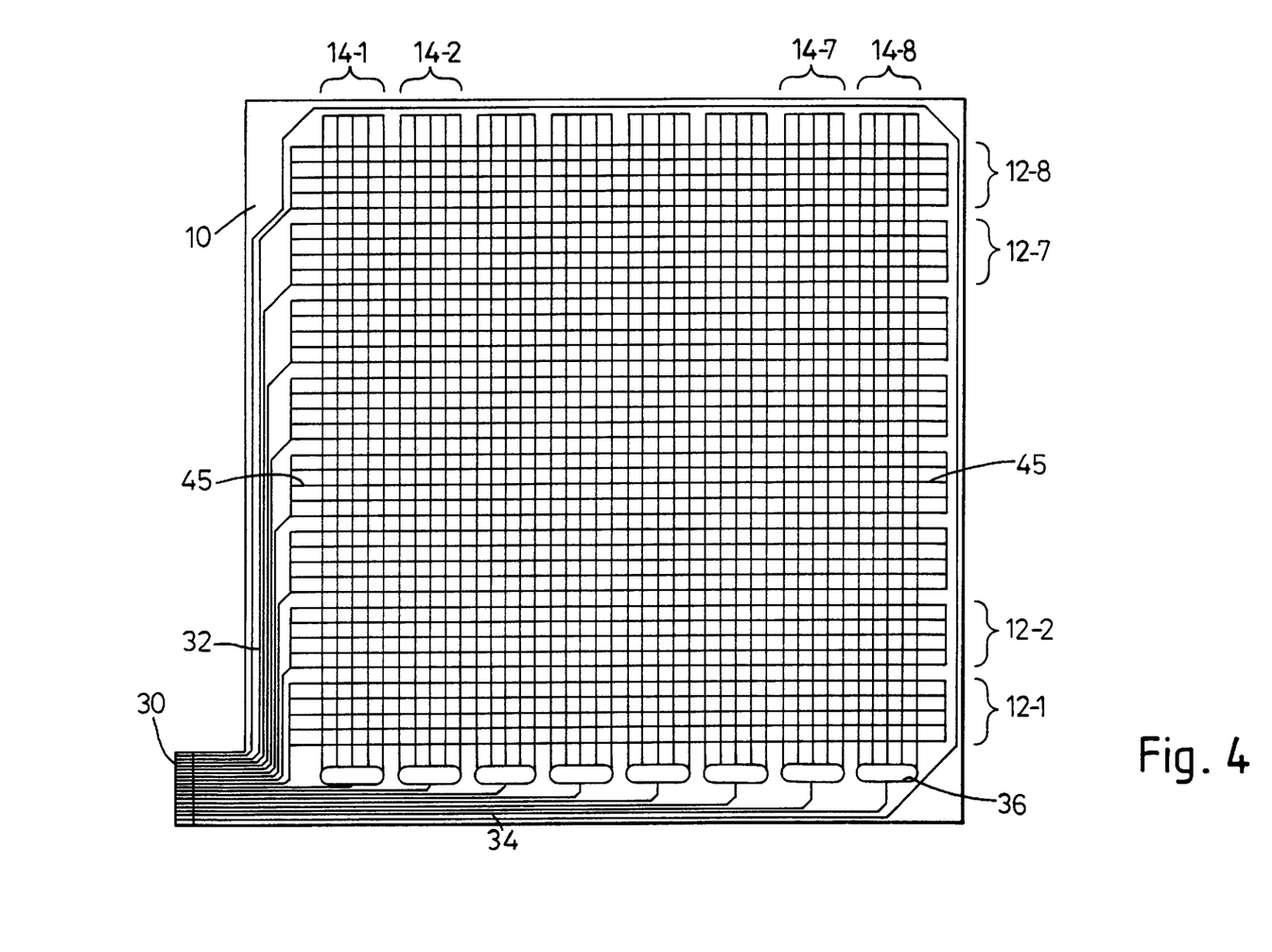
FIG. 4 shows in plan view an embodiment of the present invention suitable for a large area touchpad with multiple conducting elements.

In another embodiment, the sensitivity to changes in capacitance caused by the proximity of a finger or other object to a large area touchpad is enhanced by connecting several conductor elements 12, 14 together in groups as embodied in FIG. 4. This particular embodiment is preferred where the required positional resolution of a keystroke can be compromised in favour of an increased area of touchpad. This particular embodiment confers upon the apparatus the additional benefit that damage to one of the conductor elements 12 or 14 causing a break in that element does not affect the performance of the system, provided that the connection of each group of elements at both ends is made, as shown in the embodiment of FIG. 4. If a fine wire is used to detect a large area then the wire should be zig-zagged over that area. The wire could be zig-zagged with ¼–⅛th of an inch spacing.

Figure 5:
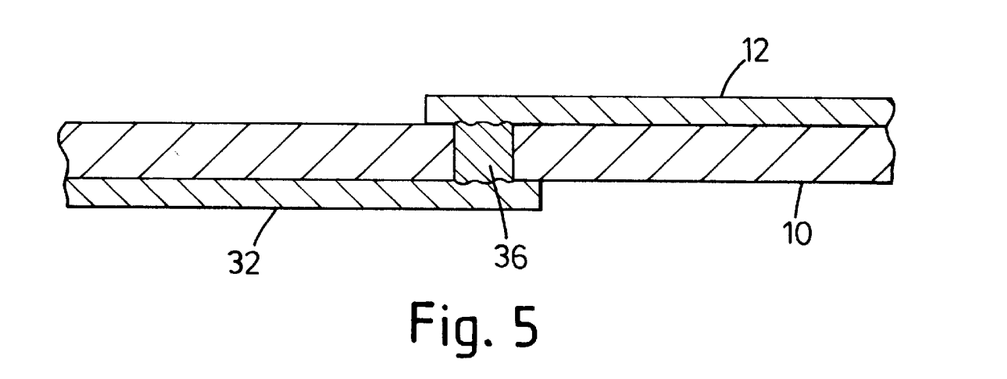
FIG. 5 shows in cross-section an embodiment of the present invention in which connections can be made between conducting elements.

If required, the conductor elements can be electrically connected to elements on the opposite face of the dielectric film 10 by the provision of appropriately placed holes 36 in the dielectric film as shown in FIGS. 4 and 5, filled with conductive material through which, for example, conductor element 12 is connected to conductor element 32 in order that connector 30 is only required to make contact to one face of the dielectric film 10. Such a system may also be used to form "underpasses" for the conductor elements if required on particularly complex conductor patterns. These "underpasses" may be used to effect the intersection points of the first series of conductor elements 12 and the second series of conductor elements 14.

It is further noted that where conductor elements are used which have significant resistance along the length thereof it is possible to minimise the impact this has by providing conductor elements 32,34 to contact both ends of conductor elements 12,14 respectively. It is further possible to provide conductor elements 32,34 in high-conductivity material, and conductor elements in the lower conductivity material, the elements being coupled together in known manner.

In a particular embodiment of this invention the required sensitivity of the system to changes in capacitance on any given element is enhanced by ensuring that all of the conductor elements 14-1 . . . 14-n and 12-1 . . . 12-n are maintained at the same potential (for example ground potential, or $V_{suppy}$ hereinafter referred to as "ground potential") except for the conductor element being sampled. The grounding of all conductor elements not being sampled greatly reduces the effect of stray capacitance from other parts of the touchpad on the element being sampled, thus providing a more reliable measure of any capacitive change that may have taken place on the conductor element being scanned.

Figure 8:
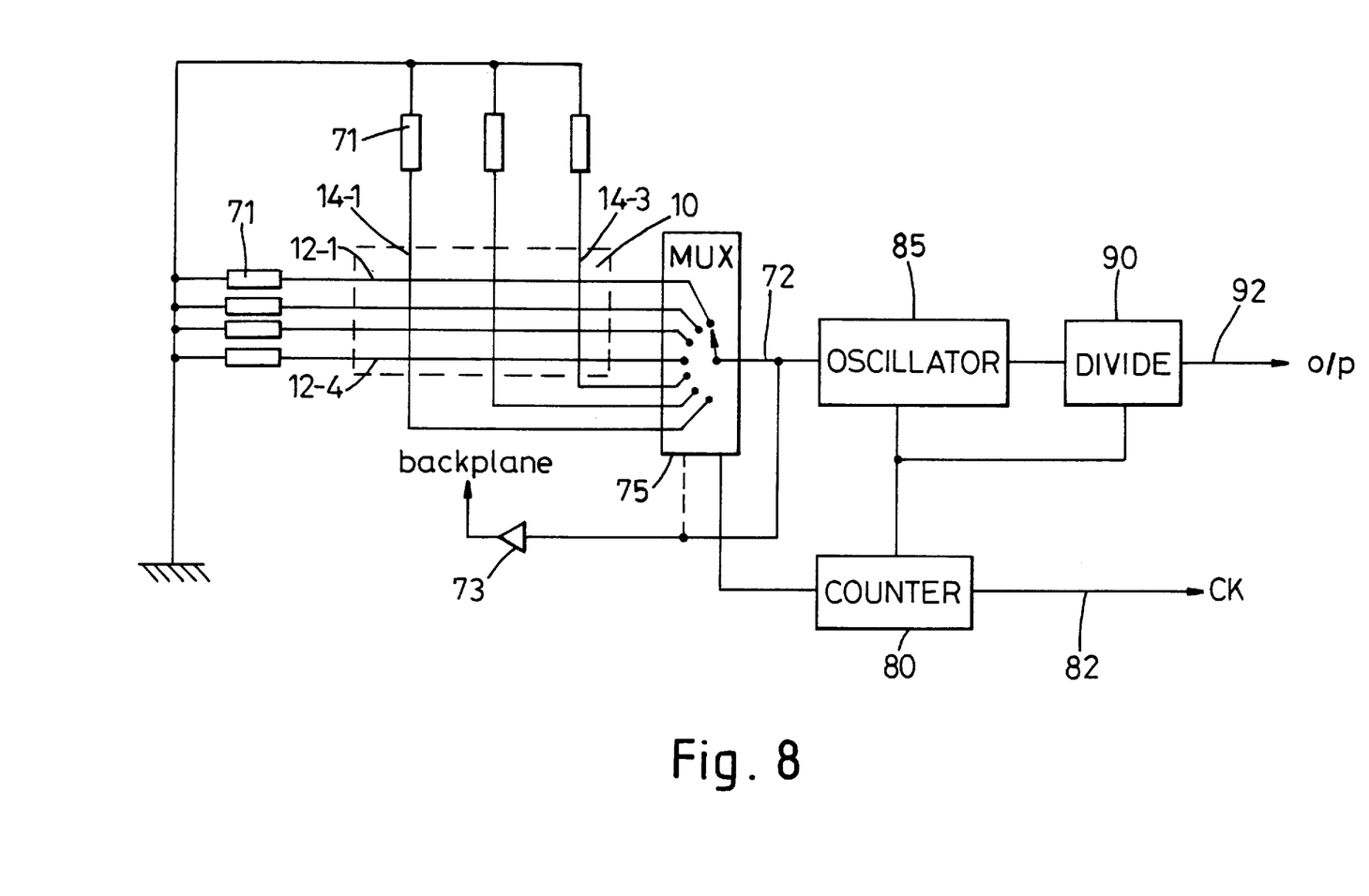
FIG. 8 shows schematically an embodiment of scanning apparatus suitable for use with the touchpad.

An appropriate system for scanning keyboards, such as that described in European Patent No. 0185671 is readily applicable with some modification to this touchpad. In one particular embodiment as shown in FIG. 8, each of conductor elements 12-1 to 12-4, and 14-1 to 14-3 is connected at one end to a resistor 71 having a high value such as 100 kohms when compared with the impedance of the detection circuit, for example 10 kohms. (The particular values of resistance used are exemplary, and may be substantially varied according to the configuration of the system.) Each of the resistors is connected to, for example, ground potential. The other end of each of conductor elements 12-1 to 12-4, and 14-1 to 14-3 is connected in turn via analogue multiplexer 75 to output line 72.

Where there is significant resistance along the length of the conductor elements 12 and 14, improvements in the performance of the detection system can be achieved by the placing of the resistors 71 at the opposite sides of the conductor elements 12 and 14 to that shown in FIG. 8. In other words, the resistors are placed at the multiplexer 75 of the touchpad and connected to ground or an active ground as hereinafter described.

Output line 72 is connected to the input of a capacitance controlled oscillator 85, the output of which is connected to a divide-by-n circuit 90, which provides the data output on line 92. An indexing counter 80, clocked by a remote clock on line 82, is operative to control the analogue multiplexer, and to reset capacitance controlled oscillator 85 and divide-by-n circuit 90. A processing means, not shown, is operative to receive the data from divide-by-n counter on line 92, and store it in a plurality of locations, each allocated to a particular one of the conductor elements 12 and 14. Divide-by-n circuit 90 and other components such as indexing counter 80 could be provided by means of a suitable standard microprocessor.

The scanning system thus samples each conductor element in turn according to the analogue multiplexer sequence, and stores each capacitance value in memory. These values are compared with reference values from earlier scans, and with other capacitance values in the same scan from the other conductor elements in order to detect a keystroke. Keystrokes must be above a threshold value to be valid. By having several threshold values it is possible to determine the pressure of key press or distance that the finger is away from the key. This may be useful, for example, when moving a cursor across a screen and then making a selection by pressing harder on a selected point.

The remaining features of the scanning mechanism are well described in the cited document and will not be discussed further here.

Figure 6:
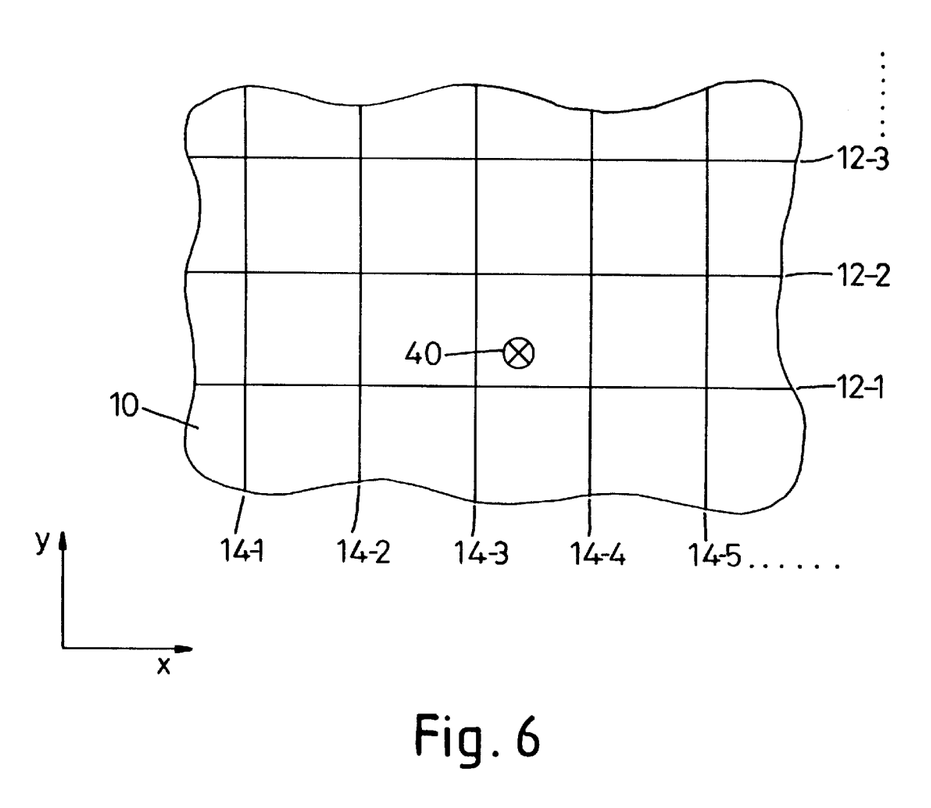
FIG. 6 shows a small part of a touchpad surface.

Detected changes in capacitance on more than one conductor element in any one scanning sequence enables interpolation of a keystroke between those conductor elements. In the two dimensional case, as shown in FIG. 6, conductor element 14-3, and conductor element 14-4 cross conductor elements 12-1 and 12-2. A finger or other object at position 40 can be determined in the X-direction by the relative effect on the capacitance of element 14-3 compared with element 14-4, and in the Y-direction by the relative effect on the capacitance of element 12-1 compared with element 12-2. In a typical application, conductor elements 12-1, 12-2 . . . 12-n and 14-1, 14-2 . . . 14-n will be sampled by the scanning system in a sequential manner. Clearly, the same applies to the embodiment of the touchpad where the conductor elements are arranged in groups where the interpolation is made between the centre line 45 of each group of conductor elements (FIG. 4).

Figure 7:
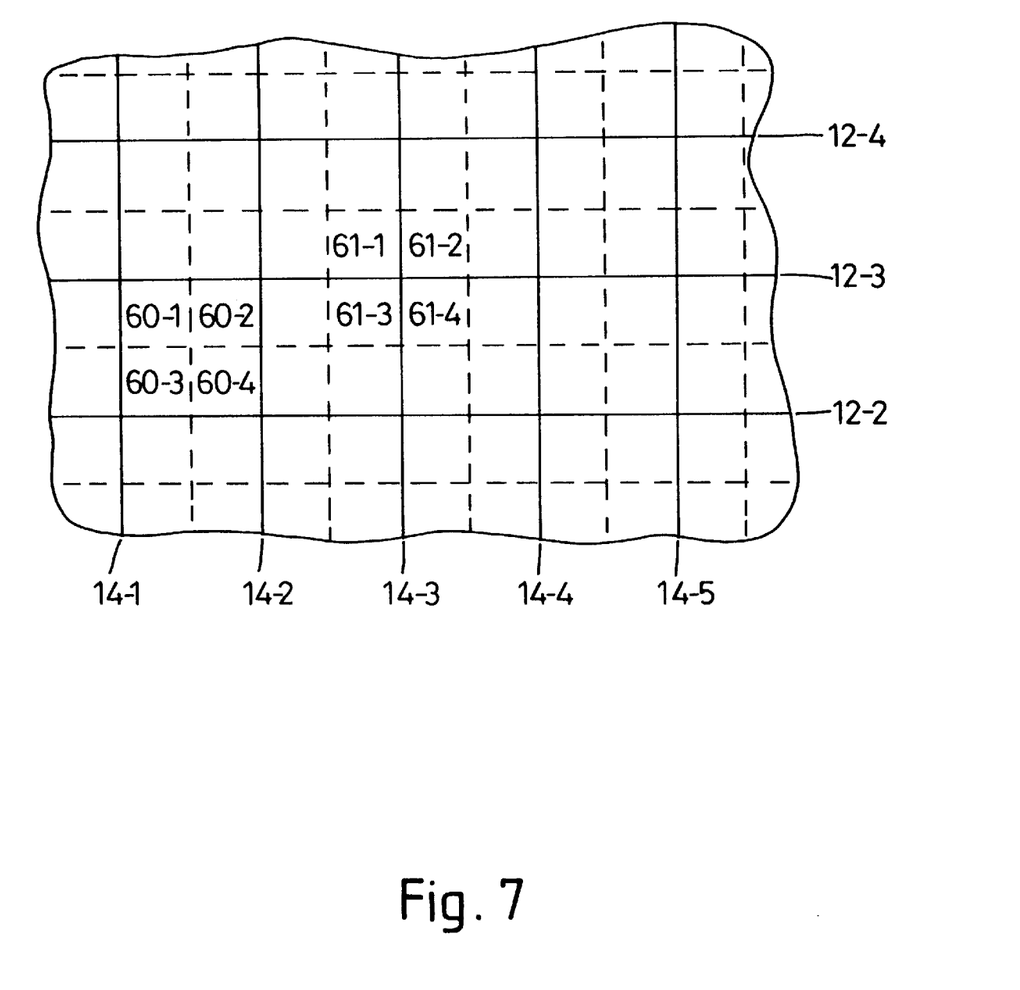
FIG. 7 shows a part of a touchpad surface indicating an embodiment of the invention in which multiple keypad areas are assigned to each intersection.

It will be clear that the interpolation technique enables not only an analogue representation of finger position on the touchpad to be created, but also allows the use of an increased number of "boxes" or predetermined key areas 60,61 over the number of element intersections, as indicated in FIG. 7. Such "boxes" or keypad areas could be arranged in any number of configurations capable of being resolved by the system.

In an alternative embodiment, an active backplane may be incorporated into the touchscreen. For example, a plastic sheet upon which is coated a conductive film is laminated to the touchscreen. The output 72 is connected to a unity gain non-inverting amplifier 73. The output of this amplifier 73 is connected to the backplane conductor (not shown) which may cover all or part of the keypad. The backplane will be active since the voltage thereon will vary with the output on line 72.

The backplane could also extend to areas in front of the keypad to "shield" keys which are non-operative.

The backplane potential thus created could also be suitably connected to maintain all conductors 12-n, 14-n which are not actively being sampled at a common potential equal to the active backplane potential rather than the common ground potential as previously described herein.

This can in certain uses of the touchscreen eliminate the requirement for a completely conductive backplane film.

Figure 9:
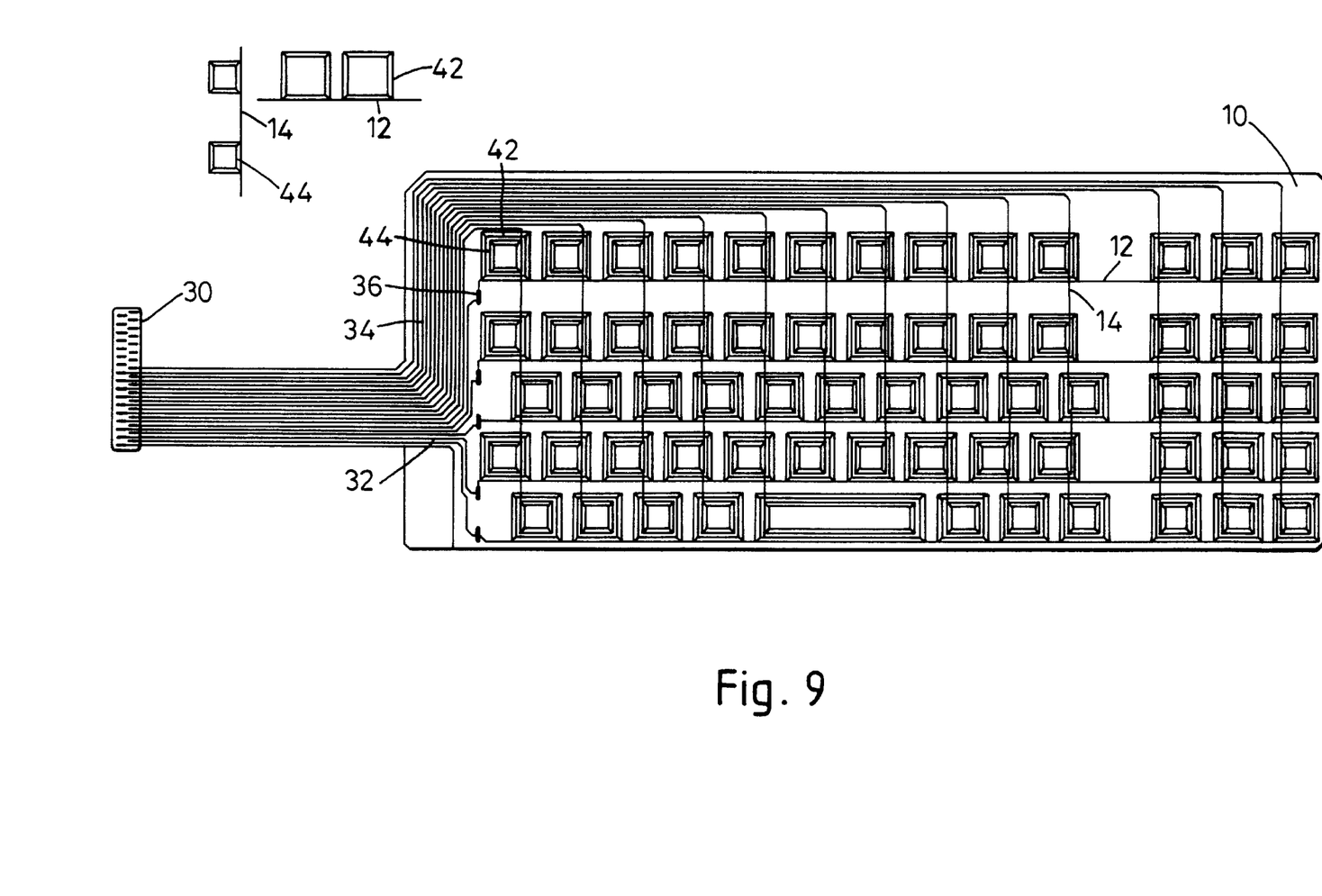
FIG. 9 shows a pattern of conductor elements suitable for use in the style of a standard typewriter keyboard layout.

In FIG. 9 there is shown an example of an appropriate pattern of elements for simulating a keypad configuration such as that normally associated with a typewriter keyboard. This particular embodiment comprises the horizontal conducting elements 12, vertical conducting elements 14, conducting elements 32, 34 for connection to connector 30 in similar manner to the embodiments described with reference to the FIGS. 1 and 2. The sensitivity of the system can be further enhanced by the addition of further conducting elements 42, 44; elements 42 being in electrical connection with conducting elements 12, and elements 44 being in electrical connection with conducting elements 14, elements 42 being positioned such that centre of a box defined by the elements 42 is superimposed on the centre of a box defined by elements 44, the elements 12, 42 being on one face of the thin dielectric film 10, and the elements 14, 44 being on the other face of the thin dielectric film 10. The separate elements 42, 44 are indicated schematically to the side of the drawing of FIG. 9.

As indicated earlier, the first and second series of conductor elements 12 and 14 need not be deposited on opposite faces of the same dielectric membrane, but might be deposited on separate dielectric membranes, with said membranes being superimposed one on the other. This principle may be extended to include a plurality of membranes, each having a separate pattern of conductor elements. These could, for example be PCB's (printed circuit boards) of known type.

The conductor elements 12,14,32 and 34 could be formed from fine conducting wires which would preferably be insulated by, for example, an 30 enamel coating. The wires 12,14 could be allowed to touch at intersections 20, electrical contact being prevented by the insulating coating. Alternatively, the wires could be arranged on either side of a suitable membrane for mounting purposes. The wires may be from 10 to 25 microns in diameter thereby being invisible to the naked eye when the invention is used as a touchscreen.

In a further embodiment of the present invention, particularly an embodiment including, for example, a plurality of membranes having conductor elements thereon, multiplexing techniques can be used. Duplicate sets of N small touchpads are arranged to form a large touchpad array. This array is superimposed upon a larger touchpad with M keys (M could be equal to N). The position of a finger or other object proximate to the first touchpad is interpretable by the system as a key stroke in any one of N possible positions. The second, larger grid pattern is used to determine which of the M possible duplicate key pads has been touched, enabling unambiguous determination of the position of the finger.

Figure 10:
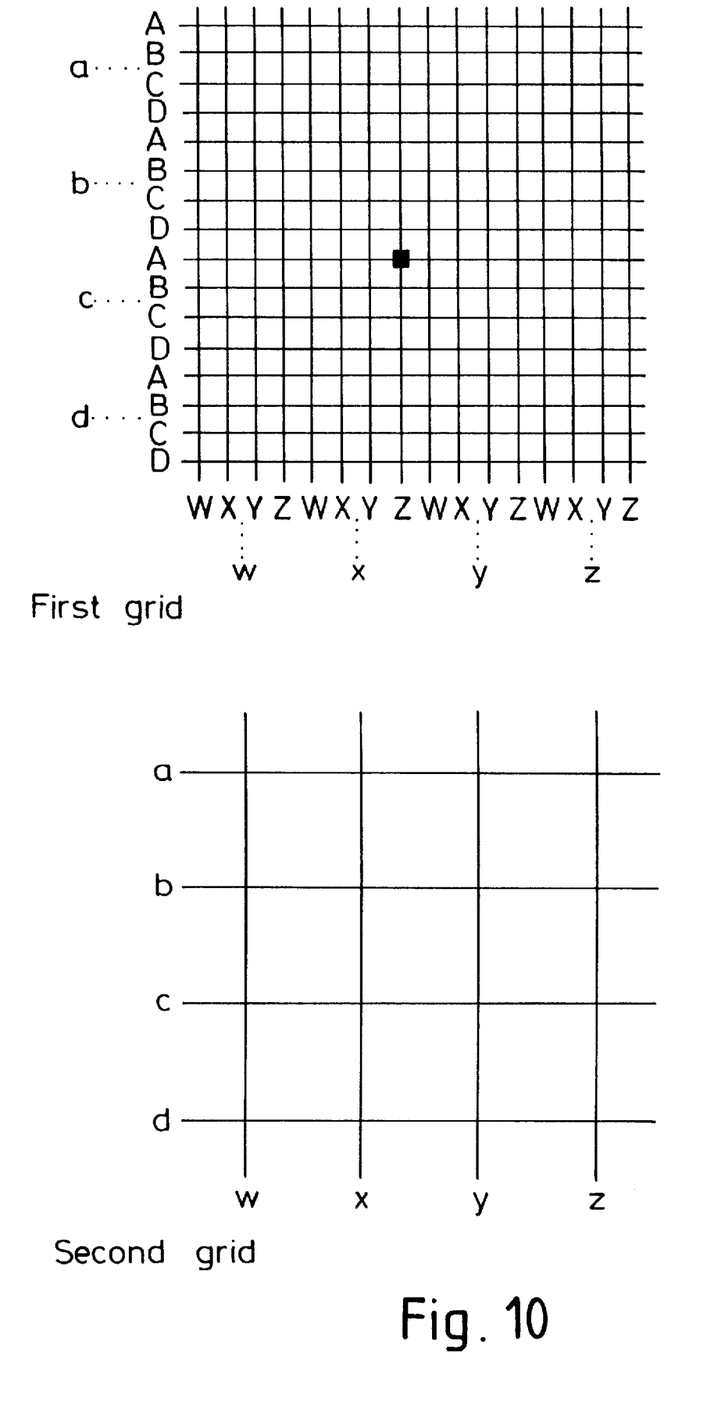
FIG. 10 shows a pattern of conductor elements demonstrating one embodiment of a multiplexed touchpad.

With reference to FIG. 10, there is a first grid pattern comprising repeating pattern of elements A to D and W to Z; that is to say that all A elements are electrically connected, all B elements are electrically connected, and so on. It is thus apparent that there will be four first grid horizontal connections A,B,C,D, and four first grid vertical connections W,X,Y,Z. A second grid is placed directly over the first grid, the second grid having four horizontal elements with four connections a,b,c,d, and four vertical elements with four connections w,x,y,z. A finger placed at the position marked with a square on the first grid will be indicated by the first grid as interference with elements A and Z. Such interference would be the same for sixteen positions on this grid, but the second grid will indicate interference with elements c and b, with c stronger than b, and interference with elements x and y, with x stronger than y. This enables unique determination of the position of the interfering object. It is readily apparent that 256 positions can thus be resolved by just 16 electrical connections. If interpolation techniques are used, more than 256 positions can be resolved.

If enamel coated wires are used then because these are insulated from each other a plurality of matrix wire arrangements can be placed on top of each other without any separating membrane.

More keys can be determined by duplicating or rearranging the order of the connections and thus determining the unique best and second best values. For example, instead of A,B,C,D, as above the order D,A,B,C,D,B, could be used.

If D gives the best value in the above example and C is the second best then it is the second D that has been selected.

If D gives the best value and A is the second best then it is the first D that has been selected.

This example can be accomplished in a linear or in a grid pattern to provide more key positions and thus can be used in combination with the interpolation techniques to provide even more key positions.

The grid patterns could be arranged as shown in FIG. 10 to be evenly spaced, but equally each four by four pattern (A–D, W–Z) could be arranged, within reason, at any location on the touchpad surface or on another surface thus providing 16 separate and distinct four by four arrays. In the extreme case, each array could be constructed to be a single key, the example shown thus providing 256 keys at remote locations but not necessarily in a defined pattern.

In a very large keyboard, it may be required to sample the elements more quickly. This can readily be achieved by sampling several elements at once. Thus for a 16×8 array, rows 1 and 9 might be sampled simultaneously, 2 and 10, 3 and 11 and so on. If only one keypad is to be operated at any one time, unambiguous determination can be obtained, since the rows will be sufficiently far apart that a stray signal will not be possible.

The outputs may be fed to different inputs of a multiplexer circuit and then to a common detector circuit. In the event that two valid outputs are received, a comparison would be made to determine the best signal, or a fault indicated requiring a further keystroke.

It will be readily apparent that the use of multiple layers of dielectric membranes could readily be scanned by several detector circuits in communication with one another.

It is further noted that the use of a first series of thin conductor elements as described herein may effectively be used to form discrete pad areas as, for example element 42 in FIG. 9 each with a separate connector line to the scanning mechanism, and without the use of a second series of conductor elements.

I claim:

1. A touchpad comprising an electrically insulating membrane (10) with a first series of spaced apart conductors (12) on a first face of said membrane (10) and a second series of spaced apart conductors (14) on or proximal thereto, in which there is no electrical contact between said first and second series of conductors (12,14), each conductor of said first and second series of conductors being sensitive to the proximity of a finger to modify the capacitance of said conductor to detect the presence of the finger positioned close to that conductor and in which said first and second series of conductors (12,14) comprise enamel coated wires having a diameter in the range of about 10 microns to about 25 microns to be substantially invisible when the touchpad is used as a touch screen.

2. A touchpad as set forth in claim 1 wherein said second series of conductors (14) is formed on a second face of said membrane (10).

3. A touchpad as set forth in claim 1 wherein said second series of conductors (14) is attached to a second insulating membrane (13).

4. A touchpad as set forth in claim 1 wherein said second series of conductors (14) is attached to said first face of said insulating membrane (10), said first series of conductors (12) being insulated from said second series of conductors (14) by discrete regions of insulating material (13').

5. A touchpad as set forth in claim 4 wherein said insulating membrane, said second insulating membrane and said insulating material (10,13,13') and said first and second series of conductors (12,14) are laminated between dielectric films (50).

6. A touchpad system including a touchpad as set forth in claim 1 including a scanning system operative to sample each one of the conductors in turn from both said first and second series of conductors (12,14) in order to measure and store a capacitance value associated with that respective conductor.

7. A touchpad system as set forth in claim 6 wherein the scanning system is capable of determining the position of the finger relative to two or more conductors by means of interpolation between such conductors.

8. A touchpad system as set forth in claim 6 wherein said touchpad includes a surface area divided into a plurality of boxes (60,61), the presence of a finger positioned on any one box being distinguishable by said touchpad system from a finger on any other box.

9. A touchpad system as set forth in claim 6 in which said touchpad includes an active backplane device.

10. A touchpad system as set forth in claim 9 wherein said scanning system is operative to maintain all conductors of said first and second series of conductors at the same potential as said active backplane device when the conductors of said first and second series of conductors are not being actively sampled by the scanning system.

11. A touchpad as set forth in claim 1 wherein said first and second series of conductors (12,14) are arranged to form a plurality of intersections (20).

12. A touchpad as set forth in claim 11 wherein the conductors of said first and second series of conductors have a first width (22) for the larger part of their length, and a second width (24) being substantially smaller than the first width at each intersection (20).

13. A touchpad as set forth in claim 1 wherein each of the conductors of said first and second series of conductors are formed from a plurality of electrically connected conducting elements.

14. A touchpad as set forth in claim 1 including a plurality of insulating membranes (10), each said insulating membrane having at least one series of conductor elements (12), and each said insulating membrane being superimposed one above another are scanned by a plurality of scanning mechanisms.

15. A touchpad as set forth in claim 1 wherein said wires are enabled to cover a large area by being zig-zagged.

16. A multiple input proximity detector comprising at least one touchpad as set forth in claim 1 in which the juxtaposition of two or more independent sensor inputs are used to determine the proximity of a finger, such detection only being accepted as valid when all of said sensor inputs indicate a valid detection, where said sensor inputs may be juxtaposed next to a range of other inputs in unique combination such that when any one combination gives a true detection for all its individual inputs, a unique valid detection is determined.

* * * * *